(12) United States Patent
Hashimoto

(10) Patent No.: US 7,343,269 B2
(45) Date of Patent: Mar. 11, 2008

(54) OBJECT DESIGNING METHOD, OBJECT DESIGNED BY SAID METHOD, AND PROGRAM FOR EXECUTING SAID METHOD

(75) Inventor: Kazuo Hashimoto, Tokyo (JP)

(73) Assignee: AEN, Inc., Tokyo (JP)

( * ) Notice: Subject to any disclaimer, the term of this patent is extended or adjusted under 35 U.S.C. 154(b) by 657 days.

(21) Appl. No.: 10/368,468

(22) Filed: Feb. 20, 2003

(65) Prior Publication Data

US 2003/0163293 A1  Aug. 28, 2003

(30) Foreign Application Priority Data

Feb. 21, 2002  (JP) .............................. 2002-45397

(51) Int. Cl.
*G06F 7/60* (2006.01)
(52) U.S. Cl. .............................................. 703/2; 703/1
(58) Field of Classification Search .................. 703/2, 703/1
See application file for complete search history.

(56) References Cited

U.S. PATENT DOCUMENTS 4,651,993 A * 3/1987 Netsch, Jr. .............. 273/157 R

FOREIGN PATENT DOCUMENTS

JP  10-289262  10/1998

OTHER PUBLICATIONS

F.S. Hill, Jr.; "Phi—A Precious Jewel", Sep. 1978, IEEE Communications Society Magazine, vol. 16, Issue 5.*
Ferdinand P. Beer at al.; "Mechanics of Materials", 1981, McGraw-Hill.*
Japanese Patent Office, Office Action mailed Aug. 7, 2007 and English Translation.

* cited by examiner

*Primary Examiner*—Paul Rodriguez
*Assistant Examiner*—Russ Guill
(74) *Attorney, Agent, or Firm*—Lowe Hauptman Ham & Berner

(57) ABSTRACT

Designing system 10 is equipped with a primary sequence setting portion 42, which computes primary golden values using the golden ratio on a set reference value and sets these primary golden values in the form of a primary numerical sequence, a secondary sequence setting portion 43, which uses the primary golden values to compute secondary golden values that are intermediate values of mutually primary golden values and sets these secondary golden values in the form of a secondary numerical sequence, a tertiary sequence setting portion 44, which uses the primary golden values to compute tertiary golden values that are intermediate values of mutually secondary golden values and sets these tertiary golden values in the form of a tertiary numerical sequence, and a designing portion 32, which carries out designing based on these primary to tertiary golden values.

9 Claims, 9 Drawing Sheets

FIG. 5

GENERATE φ TETRAGON

φ TETRAGON
- CLASS: GENERAL
- LAYER: LAYER-1

φ INPUT

```
      P  9  8  7  6  5  4  3  2  1  0   GS
                                         △
      ○  ○  ○  ○  ○  ○  ○  ○  ○  ○  ○    1
△X    ○  ○  ○  ○  ○  ○  ○  ○  ○  ○  ●    0
      ○  ○  ○  ○  ○  ○  ○  ○  ○  ○  ○   -1
                                         ▽
```

```
      P  9  8  7  6  5  4  3  2  1  0   GS
                                         △
      ○  ○  ○  ○  ○  ○  ○  ○  ○  ○  ○    0
△Y    ○  ○  ○  ○  ○  ○  ○  ○  ○  ○  ○   -1
      ○  ○  ○  ○  ○  ○  ○  ○  ○  ●  ○   -2
                                         ▽
```

△X: [ 0 ] GS  [ 0 ] P   ◁  ▷
△Y: [ -2 ]   [ 0 ] P   ◁  ▷

△X: 2000
△Y: 763.9
X: 0
Y: 25.4

☑ DECIDE POSITION BY MOUSE CLICKING

AREA: 1527864 sqmm
PERIMETER: 5527.9

[ CANCEL ]    [ OK ]

US 7,343,269 B2

OBJECT DESIGNING METHOD, OBJECT DESIGNED BY SAID METHOD, AND PROGRAM FOR EXECUTING SAID METHOD

BACKGROUND OF THE INVENTION

1. Field of the Invention

This invention concerns a method of designing an object, an object designed by this method, and a program for executing this method, and for example, concerns a method of designing an object using a CAD software, etc., a method of preparing printed matter using a DTP software, etc., an object or printed matter designed by this method, and a program for executing this method.

2. Description of Related Art

A method of design, in which a scale called modulor is introduced to design the shape or size of an object, has been proposed priorly. For example, numerical sequences, called a red sequence and a blue sequence have been proposed by the architect, Le Corbusier.

The red sequence is a numerical sequence derived using the height to the umbilicus (1130 mm) of a human being with a height of 1829 mm (6 feet) as a unit. The red sequence is comprised of the values of 6, 9, 15, 24, 39, 63, 102, 165, 267, 432, 698, 1130, and 1829.

The blue sequence is a numerical sequence derived using the height to the raised hand (2260 mm) of a human being with a height of 1829 mm (6 feet) as a unit. The blue sequence is comprised of the values of 11, 18, 30, 48, 78, 126, 204, 330, 534, 863, 1397, and 2260.

The values that respectively comprise the red sequence and blue sequence mentioned above are determined by multiplying or dividing the unit of each numerical sequence by the golden ratio ø. Here, the golden ratio ø is an irrational number expressed as follows:

$$ø=(1+\sqrt{5})/2=1.618\ldots$$

The numerical values that make up the blue sequence are computed by mutual addition or subtraction of numerical values that make up the red sequence. For example, 1397, which is a member of the blue sequence, is the sum of 1130 and 267, which are members of the red sequence. On the other hand, numerical values that make up the red sequence cannot be computed by mutual addition or subtraction of the numerical values that make up the blue sequence. A numerical value of the blue sequence is an intermediate value of numerical values of the red sequence.

Based on the idea that industrial products, etc., of well-proportioned and balanced form can be formed by the use of such numerical sequences using the golden ratio, designing by application of numerical sequences that use the golden ratio have been attempted.

However, since the numerical sequences of the above-mentioned proposition are computed by multiplying and dividing a reference value, the interval between numerical values is large, thus there were cases where values necessary for design could not be obtained and objects of the desired size could not be designed. In particular, the interval between numerical values became greater the greater the numerical values of the numerical sequence.

Thus even though a numerical sequence can be used to determine overall proportions, the same numerical sequence could not be used for the design of details.

A merit of using golden values in design is that even if the golden values are combined as suited, the golden values will be compatible as long as they are computed from the same reference value.

For example, in a case where a container and a plurality of objects to be contained are designed using golden values, if the container and the objects are manufactured as accurately as possible with respect to the golden values, the objects will be contained exactly and without gaps in the containers, and on the other hand, if dimensions are rounded to rough significant digits, large gaps will occur or the objects to be contained will not fit inside the container.

However, with Le Corbusier's red sequence and blue sequence, values that are rounded to the nearest mm are used. Thus when the proposed numerical sequences are used, the errors accumulate and compatibility cannot be maintained. That is, the values are no longer golden values once they have been rounded to the nearest mm. An indication method that takes the place of such numerical sequences is thus needed.

SUMMARY OF THE INVENTION

Main objects of this invention are to enable industrial designs and graphic designs of high degrees of freedom to be made even when using golden values and to provide a program for this purpose.

This invention's designing method is a designing method for designing objects and printed matter using the golden ratio and comprises: a primary sequence setting step of computing primary golden values by using the golden ratio on a set reference value and setting these primary golden values in the form of a primary sequence; an (n+1)-ary sequence setting step of using the abovementioned primary golden values to compute (n+1)-ary golden values that are intermediate values of mutually n-ary golden values and setting these (n+1)-ary golden values in the form of an (n+1)-ary sequence; and a designing step of making a design based on these primary to (n+1)-ary golden values; and is characterized in that the value of the abovementioned n is an integer value of at least 2 or the number of secondary golden values intermediate the respective mutually primary golden values is at least 2.

By this invention, since (n+1)-ary golden values are set in the form of intermediate values of mutually n-ary golden values, even if the difference between the n-ary golden values is great, an arbitrary number of intermediate values can be prepared by setting the (n+1)-ary golden values as intermediate values of mutually n-ary golden values or by furthermore setting intermediate values of the (n+1)-ary golden values, and the golden values necessary for design can be obtained readily from among such values. A design of a high degree of freedom can thus be realized using golden values.

Also, golden values of the respective orders from the primary to the n-ary are set, and thus, for example with golden values to be employed in the design of an object, a priority order can be set in accordance with the orders of the golden values to further facilitate the designing work.

With this invention's designing method, at least one of the abovementioned primary to (n+1)-ary golden values is preferably provided with a code for identifying the golden value.

Here, the code for identifying the golden value is comprised of a name, numeral, alphabetic character, symbol, or combination of these.

As described above, since priorly, golden values were computed by multiplying or dividing a reference value by the golden ratio ø, which is an irrational number, the values were not well-rounded values and were difficult to express using numerals. Such values were therefore inadequate for designing objects with compatibility.

By this invention, since at least one of the golden values of the respective orders is provided with a code for identification of the golden value and the respective orders' golden values, which are expressed as irrational numbers as a rule, can be specified readily, accurate designing work can be carried out using not approximations of golden values but golden values themselves.

In particular, by computing n-ary golden values in a systematic manner and providing these golden values with codes in a systematic manner, the golden values can be specified readily from the codes and enable designing work to be carried out even more readily.

Since each golden value can be specified accurately by providing each golden value with a code, a golden value can be expressed by a combination of different golden values, that is, mutual compatibility among the golden values can be secured to enable objects with compatibility to be designed readily.

Primary golden values may be computed for example by multiplying or dividing a reference value by the golden ratio once or a plurality of times. With this arrangement, primary golden values, ranging from those that are extremely small compared to the reference value to those that are extremely large compared to the reference value can be computed readily.

For example, n-ary golden values may be computed by multiplying or dividing primary golden values by each other once or a plurality of times.

With this invention, the designing step may include: an origin setting step of setting a selected point on a design drawing as an origin; and a first point setting step of selecting one golden value among the primary to n-ary golden values and setting a point separated from the abovementioned origin by the abovementioned selected golden value.

With this arrangement, since by just the selection of a point and a golden value by an operator, the selected point is set as the origin and a point that is separated from the origin by the selected golden value is set on the design drawing, the designing work using golden values can be carried out readily and speedily.

With this invention, the designing step may include: an origin setting step of setting a selected point on a design drawing as an origin; and a second point setting step of inputting a numerical value, selecting a golden value that most closely approximates the abovementioned input numerical value from among the abovementioned primary to n-ary golden values, and setting a point that is separated from the abovementioned origin by just the selected golden value.

With this arrangement, since by just the selection of a point and the input of a numerical value by an operator, the selected point is set as the origin, a golden value approximating the input numerical value is selected and a point that is separated from the origin by just the selected golden value is set on the design drawing, the designing work using golden values can be carried out readily and speedily.

With this invention, the designing step may include: a significant digit order setting step of setting an input numerical value as the number of significant digits; and a golden value indication step of selecting two points on a design drawing, computing the dimension between the two selected points, and when a value among the abovementioned primary to (n+1)-ary golden value matches the computed dimension down to the abovementioned number of significant digits, indicating this matched golden value.

With this arrangement, since by just the input of a numerical value and the selection of two points by an operator, the input numerical value is set as the number of significant digits and a dimension between two arbitrary points is indicated by a golden value, the designing work can be carried out readily and speedily using golden values.

An object by this invention is characterized in being designed by the above-described designing method of this invention.

By this invention, objects that make use of golden value can be obtained. This invention can be applied especially effectively to objects that are in a relationship of a container and objects to be contained, such as a refrigerator and food packages, a container and corrugated cardboard, toy building blocks, etc.

This invention's program is a program for making a computer execute the above-described designing method of this invention.

With this program, a computer can be made, upon installing this invention's program in the computer, to execute the above-described designing method of this invention and thereby promote the usage of this invention's designing method.

BRIEF DESCRIPTION OF THE DRAWINGS

FIG. 5 is a diagram, showing a golden value selection screen for tetragon generation of the abovementioned embodiment.

DETAILED DESCRIPTION OF PREFERRED EMBODIMENT(S)

An embodiment of this invention shall now be described based on the drawings.

Figure 1:
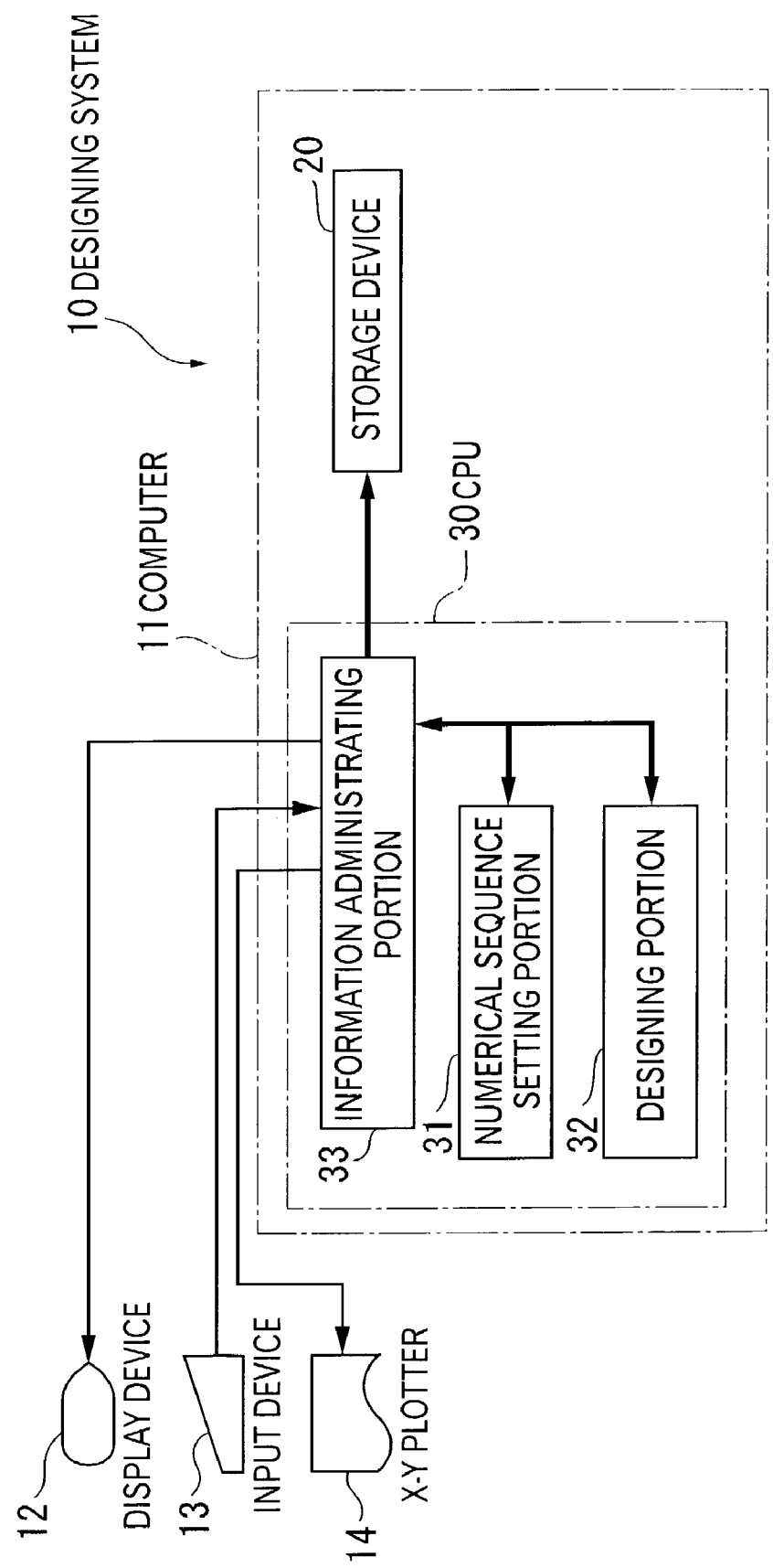
FIG. 1 is a block diagram, showing a designing system for executing a designing method of an embodiment of this invention.

FIG. 1 is a block diagram of a designing system 10 for executing the designing method of this embodiment.

Designing system 10 is provided with a computer 11, which serves as the core for this method, a CRT display, liquid crystal display, or other display device 12, which displays a plan view diagram, etc., that is being subject to designing, a keyboard, numeric keypad, mouse, or other input device 13 for operating computer 11, etc., and an X-Y plotter 14 (may also be a printer, etc., that can print out an image) for drawing the designed plan view diagram, etc.

Computer 11 includes a CPU 30, which is the computing device for carrying out various processes, and a hard disk, memory, or other storage device 20.

CPU 30 has various software installed therein and has a multitask function for parallel processing of these software.

CPU 30 is provided, by means of software, with a numerical sequence setting portion 31, which uses the golden ratio to set up sequences of golden values computed from a reference value, a designing portion 32, which executes a designing step, wherein the numerical sequences set by numerical sequence setting portion 31 are used to carry out designing, and an information administrating portion 33, which manages the input and output of data stored in storage device 20.

Storage device 20 stores the sequences set by numerical sequence setting portion 31.

Figure 2:
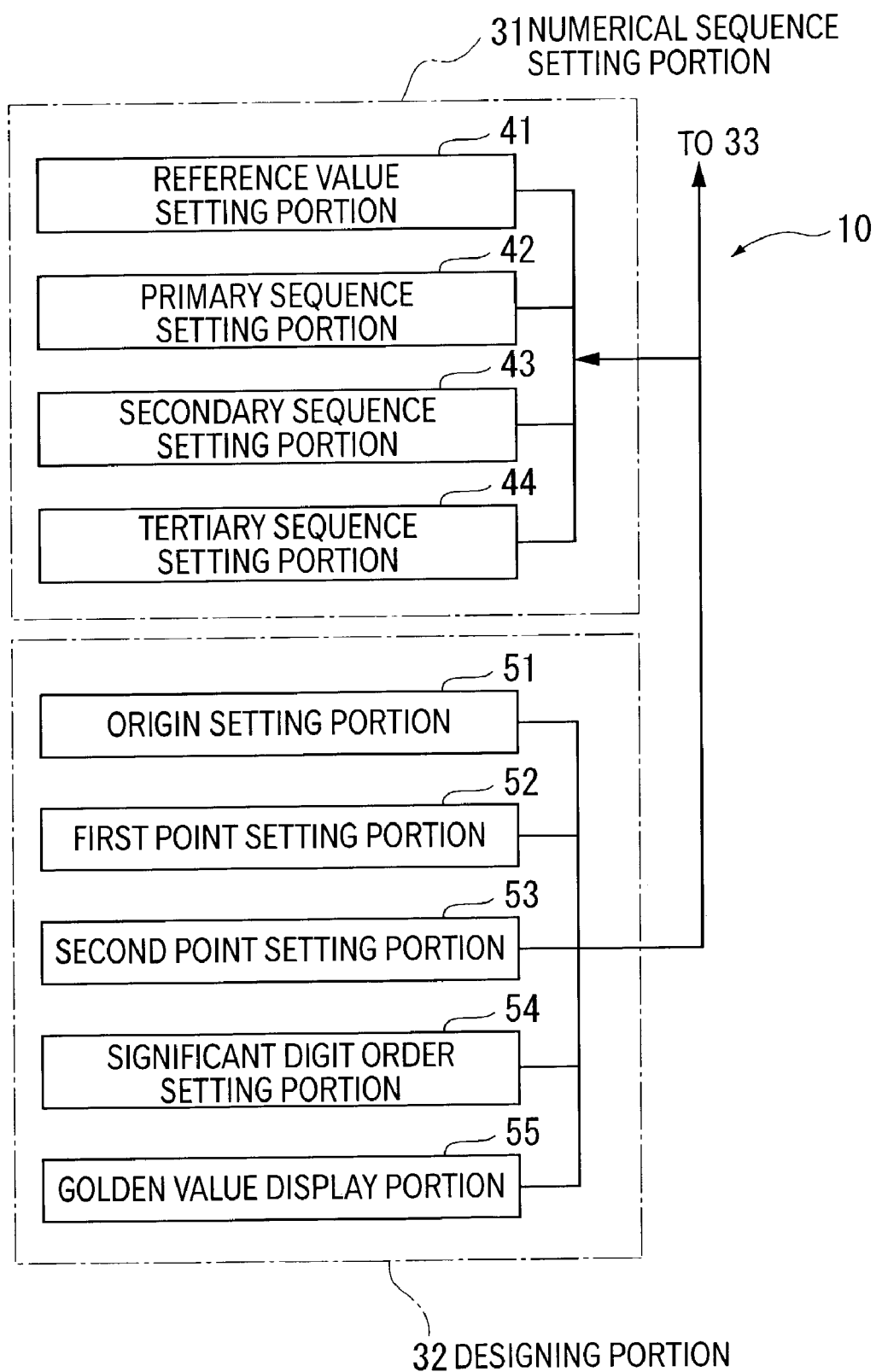
FIG. 2 is a detailed block diagram of the designing system of the abovementioned embodiment.

FIG. 2 is a block diagram of numerical sequence setting portion 31 and designing portion 32.

Numerical sequence setting portion 31 is provided with a reference value setting portion 41, a primary sequence setting portion 42, a secondary sequence setting portion 43, and a tertiary sequence setting portion 44.

When an operator inputs an arbitrary numerical value by means of input device 13, reference value setting portion 41 sets this input numerical value as reference value BL.

Primary sequence setting portion 42 computes primary golden values by multiplying and dividing reference value BL by the golden ratio ø once or a plurality of times, provides these primary golden values with codes XGS (where X is an integer), and sets up a sequence, in which these values are arranged in decreasing order, as a primary sequence. Here, the golden ratio ø is expressed as follows:

$$\emptyset = \frac{1+\sqrt{5}}{2}$$

To be more specific, reference value BL is provided with the symbol 0GS, a primary golden value obtained by multiplying reference value BL by the golden ratio ø once is provided with the symbol 1GS, and a primary golden value obtained by multiplying reference value BL by the golden ratio ø twice is provided with the symbol 2GS. In likewise manner, successive primary golden values are calculated and provided with symbols 3GS, 4GS, . . . . Also, a primary golden value obtained by dividing reference value BL by the golden ratio ø once is provided with the symbol −1GS, and a primary golden value obtained by dividing reference value BL by the golden ratio ø twice is provided with the symbol −2GS. In likewise manner, successive primary golden values are calculated and provided with symbols −3GS, −4GS, . . . .

The above primary golden values XGS are then arranged in decreasing order, that is, in the order of . . . 3GS, 2GS, 1GS, 0GS, −1GS, −2GS, −3GS, . . . and set in the form of the primary sequence.

The primary golden values XGS are thus computed as follows.

3GS=BL*ø*ø*ø
2GS=BL*ø*ø
1GS=BL*ø
0GS=BL
−1GS=BL/ø
−2GS=BL/ø/ø
−3GS=BL/ø/ø/ø

Secondary sequence setting portion 43 performs addition or subtraction of primary golden values XGS by themselves once or a plurality of times to compute secondary golden values as intermediate values of adjacent primary golden values XGS and X−1GS, provides these secondary golden values with codes YP (where Y is an integer from 0 to 9), and sets a sequence in which these values are arranged in decreasing order as a secondary sequence.

Hereinafter, a secondary golden value YP that has been set as an intermediate value of primary golden values XGS and X−1GS shall be referred to as XGS, YP.

To be more specific, here, 9 secondary golden values YP are set as intermediate values of primary golden values XGS and X−1GS. For example, secondary golden values 1P to 9P are computed as follows as intermediate values of 0GS and 1GS.

1P = 0GS + (−7GS)
2P = 0GS + (−6GS)
3P = 0GS + (−5GS)
4P = 0GS + (−4GS)
5P = 0GS + (−3GS)
6P = 0GS + (−2GS) = 1GS + (−3GS)
7P = 1GS + (−4GS)
8P = 1GS + (−5GS)
9P = 1GS + (−6GS)

If reference value BL is set equal to 2000 and secondary golden values YP are determined in the same manner as the above-described computation method, the relationship between primary golden values XGS and secondary golden values YP is expressed as shown in the following table.

TABLE 1

| *1 | 9P | 8P | 7P | 6P | 5P | 4P | 3P | 2P | 1P | *3 | *4 |
|---|---|---|---|---|---|---|---|---|---|---|---|
| *2 | 5055.73 | 4944.27 | 4763.93 | 4472.14 | 4000.00 | 3708.20 | 3527.86 | 3416.41 | 3347.52 | 3236.07 | 1GS |
|  | 3124.61 | 3055.73 | 2944.27 | 2763.93 | 2472.14 | 2291.80 | 2180.34 | 2111.46 | 2068.88 | 2000.00 | 0GS |
|  | 1931.12 | 1888.54 | 1819.66 | 1708.20 | 1527.86 | 1416.41 | 1347.52 | 1304.95 | 1278.64 | 1236.07 | −1GS |
|  | 1193.50 | 1167.18 | 1124.61 | 1055.73 | 944.27 | 875.39 | 832.82 | 806.50 | 790.24 | 763.93 | −2GS |
|  | 737.62 | 721.36 | 695.05 | 652.48 | 583.59 | 541.02 | 514.71 | 498.45 | 488.40 | 472.14 | −3GS |
|  | 455.87 | 445.82 | 429.56 | 403.25 | 360.68 | 334.37 | 318.11 | 308.06 | 301.85 | 291.80 | −4GS |
|  | 281.75 | 275.53 | 265.48 | 249.22 | 222.91 | 206.65 | 196.60 | 190.39 | 186.55 | 180.34 | −5GS |
|  | 174.13 | 170.29 | 164.08 | 154.03 | 137.77 | 127.72 | 121.51 | 117.67 | 115.29 | 111.46 | −6GS |
|  | 107.62 | 105.24 | 101.41 | 95.19 | 85.14 | 78.93 | 75.09 | 72.72 | 71.26 | 68.88 | −7GS |
|  | 66.51 | 65.04 | 62.67 | 58.83 | 52.62 | 48.78 | 46.41 | 44.94 | 44.04 | 42.57 | −8GS |

*1: Secondary golden value YP
*2: Secondary golden values between 0GS and 1GS
*3: Primary sequence
*4: Primary golden value XGS The above table shows the relationship between the primary sequence made up of primary golden values 1GS to −8GS and the secondary sequence made up of secondary golden values 1P to 9P determined as intermediate values of the primary golden values 1GS to −8GS.

Tertiary sequence setting portion 44 performs addition or subtraction of primary golden values XGS by themselves once or a plurality of times to compute tertiary golden values as intermediate values of adjacent secondary golden values YP and Y−1P, provides these tertiary golden values with codes ZP (where Z is a number at the first digit below the decimal point), and sets a sequence in which these values are arranged in decreasing order as a tertiary sequence.

Hereinafter, a tertiary golden value ZP that has been set as an intermediate value of secondary golden values XGS and YP, and XGS and Y–1P shall be referred to as XGS, Y.ZP.

To be more specific, here, 9 tertiary golden values ZP are set as intermediate values of secondary golden values YP and Y–1P. For example, tertiary golden values 5.1P to 5.9P are computed as follows as intermediate values of 5P and 6P.

---
5.1P = 5P + (–10GS)
5.2P = 5P + (–9GS)
5.3P = 5P + (–8GS)
5.4P = 5P + (–7GS)
5.5P = 5P + (–6GS)
5.6P = 5P + (–5GS) = 6P + (–6GS)
5.7P = 6P + (–7GS)
5.8P = 6P + (–8GS)
5.9P = 6P + (–9GS)
---

The relationship between primary golden values XGS, secondary golden values YP, and tertiary golden values ZP are expressed as shown in the following table.

The above shows that primary golden value 0GS can be expressed by various combinations of primary golden values XGS and secondary golden values YP and that there is compatibility among the golden values of the respective orders.

Returning now to FIG. 2, designing portion 32 is provided with an origin setting portion, a first point setting portion 52, a second point setting portion 53, a significant digit order setting portion 54, and a golden value displaying portion 55.

Origin setting portion 51 sets a point, which is selected from within a design drawing displayed on display device 12 by an operator, as an origin.

First point setting portion 52 sets a point that is separated from the origin by a golden value, which is selected by the operator from among the primary golden values XGS and secondary golden values YP.

Second point setting portion 53 sets a point that is separated from the origin by a golden value, which, upon input of a numerical value by an operator, is selected, from among the primary golden values XGS and secondary golden values YP, as the golden value that most closely approximates the input numerical value.

Significant digit order setting portion 54 sets a numerical value input by an operator as the number of significant digits

TABLE 2

| *5 | 6P | 5.9P | 5.8P | 5.7P | 5.6P | 5.5P | 5.4P | 5.3P | 5.2P | 5.1P | 5P | *6 | *7 |
|---|---|---|---|---|---|---|---|---|---|---|---|---|---|
| | 4472.14 | 4429.56 | 4403.25 | 4360.68 | 4291.80 | 4180.34 | 4111.46 | 4068.88 | 4042.57 | 4026.31 | 4000.00 | 3236.07 | 1GS |
| | 2763.93 | 2737.62 | 2721.36 | 2695.05 | 2652.48 | 2583.59 | 2541.02 | 2514.71 | 2498.45 | 2488.40 | 2472.14 | 2000.00 | 0GS |
| | 1708.20 | 1691.94 | 1681.89 | 1665.63 | 1639.32 | 1596.75 | 1570.44 | 1554.18 | 1544.13 | 1537.91 | 1527.86 | 1236.07 | –1GS |
| | 1055.73 | 1045.68 | 1039.47 | 1029.42 | 1013.16 | 986.84 | 970.58 | 960.53 | 954.32 | 950.48 | 944.27 | 763.93 | –2GS |
| | 652.48 | 646.26 | 642.43 | 636.21 | 626.16 | 609.90 | 599.85 | 593.64 | 589.80 | 587.43 | 583.59 | 472.14 | –3GS |
| | 403.25 | 399.41 | 397.04 | 393.20 | 386.99 | 376.94 | 370.73 | 366.89 | 364.52 | 363.05 | 360.68 | 291.80 | –4GS |
| | 249.22 | 246.85 | 245.38 | 243.01 | 239.17 | 232.96 | 229.12 | 226.75 | 225.28 | 224.38 | 222.91 | 180.34 | –5GS |
| | 154.03 | 152.56 | 151.66 | 150.19 | 147.82 | 143.98 | 141.16 | 140.14 | 139.23 | 138.67 | 137.77 | 111.46 | –6GS |
| | 95.19 | 94.29 | 93.73 | 92.82 | 91.36 | 88.98 | 87.52 | 86.61 | 86.05 | 85.71 | 85.14 | 68.88 | –7GS |
| | 58.83 | 58.27 | 57.93 | 57.37 | 56.46 | 54.99 | 54.09 | 53.53 | 53.18 | 52.97 | 52.62 | 42.57 | –8GS |
| | 36.36 | 36.02 | 35.80 | 35.46 | 34.89 | 33.99 | 33.43 | 33.08 | 32.87 | 32.74 | 32.52 | 26.31 | –9GS |
| | 22.47 | 22.26 | 22.13 | 21.91 | 21.57 | 21.01 | 20.66 | 20.45 | 20.31 | 20.23 | 20.10 | 16.26 | –10GS |

*5: Tertiary golden values 5.ZP, which are intermediate values between 5P and 6P
*6: Primary sequence
*7: Primary golden value XGS The above table shows the relationship between the secondary golden values 5P and 6P of primary golden values 1GS to –10GS and the tertiary golden values 5.1P to 5.9P, which are intermediate values between 5P and 6P.

Figure 3:
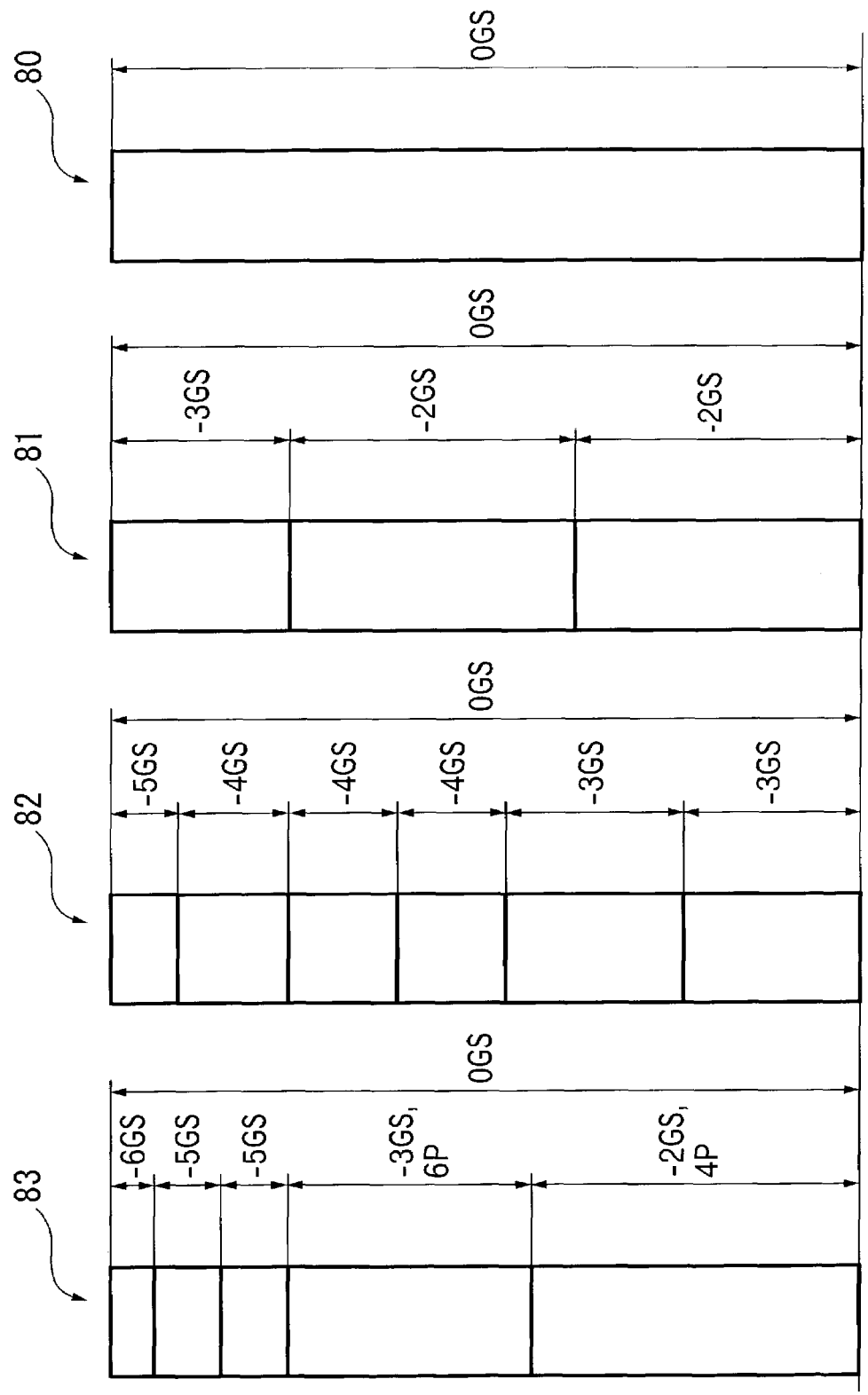
FIG. 3 is a diagram for explaining the compatibility of the designing system of the abovementioned embodiment.

FIG. 3 shows four tetragons 80 to 83 as examples formed by using the above golden values of the respective orders. All tetragons 80 to 83 have the same size and with each, the height dimension is 0GS.

Tetragon 80 is arranged as a single tetragon with the height dimension 0GS (2000.00).

Tetragon 81 is arranged from two tetragons with the height dimension –2GS (763.93 . . . ) and a single tetragon with the height dimension –3GS (472.14 . . . ).

Tetragon 82 is arranged from two tetragons with the height dimension –3GS (472.14 . . . ), three tetragons with the height dimension –4GS (291.80 . . . ), and a single tetragon with the height dimension –5GS (180.34 . . . ).

Tetragon 83 is arranged from a single tetragon with the height dimension –2GS, 4P (875.39 . . . ), one tetragon with the height dimension –3GS, 6P (472.14 . . . ), two tetragons with the height dimension –5GS (180.34 . . . ), and a single tetragon with the height dimension –6GS (111.46 . . . ).

of the primary golden values XGS, secondary golden values YP, and tertiary golden values ZP.

Golden value displaying portion 55 calculates the dimension between two points selected by an operator, and if this calculated dimension matches any of the primary golden values XGS to tertiary golden values ZP down to the number of significant digits set by significant digit order setting portion 54, displays the code of this matching golden value along with the actual dimensions.

Also with regard to the dimension line, just the code of the golden value may be displayed without displaying the actual dimensions.

The operation of this embodiment in designing work shall now be described.

Here, a case where a tetragon is designed on a design drawing shall be described.

A menu, by which a process can be selected from among the respective processes of a golden sequence setting process, designing process, etc., is displayed on the screen of display device 12.

When the operator selects the golden sequence setting process, reference value setting portion 41 is started up. Here for example, if 2000 is input as the reference value, reference value setting portion 41 sets the reference value BL equal to 2000 and primary to tertiary sequence setting portions 42 to 44 set up the primary numerical sequence, comprised of primary golden values XGS, the secondary numerical sequence, comprised of secondary golden values YP, and the tertiary numerical sequence, comprised of tertiary golden values ZP.

These primary to tertiary numerical sequences are stored in storage device 20 and a part or all of them are displayed as golden sequences.

[Generation of a Tetragon]

Next, when the operator selects the designing process, designing portion 32 is started up, the screen is switched, and a design drawing is displayed along with a tool pallet that contains various tools for tetragon generation, rotation, inversion, enlargement, and reduction of shapes, dimension line generation, etc.

Figure 4:
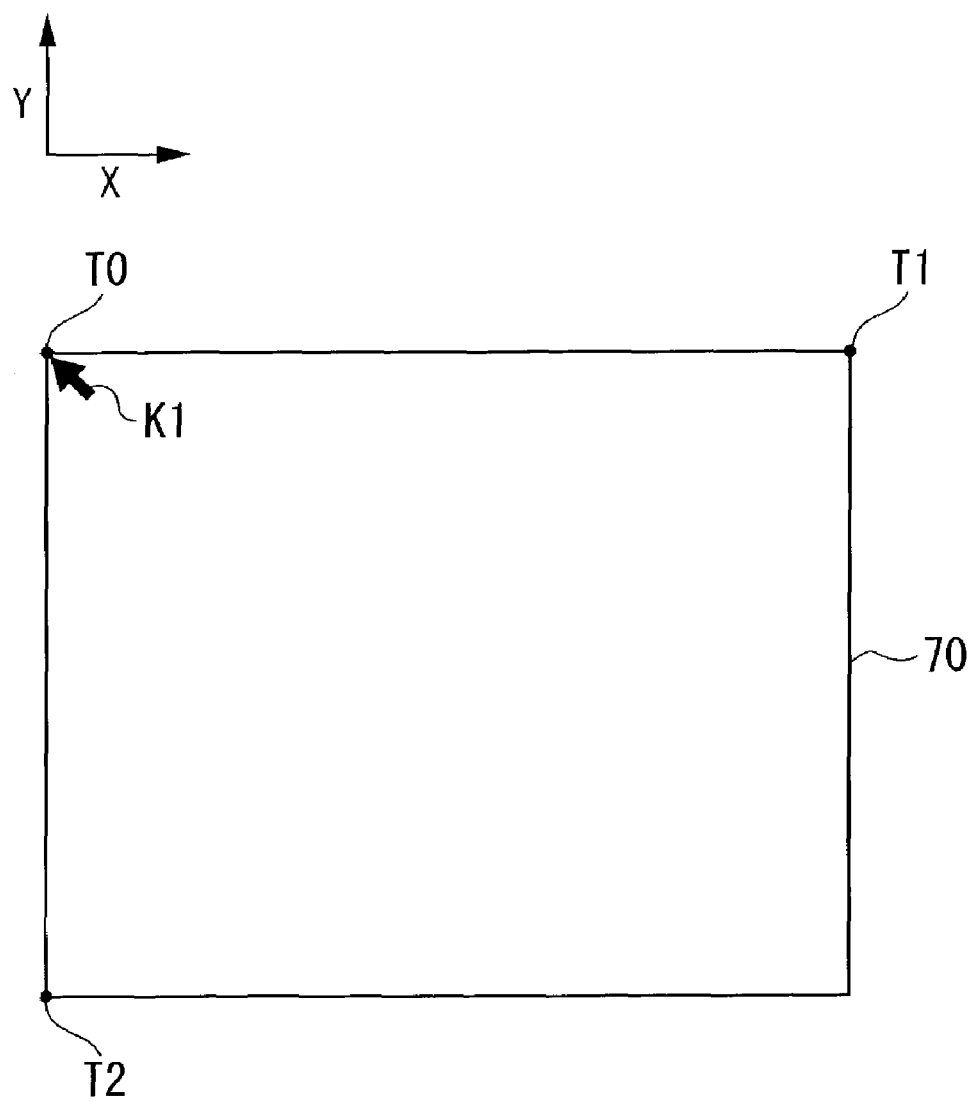
FIG. 4 is a diagram, showing a tetragon generating screen of the abovementioned embodiment.

The tetragon generation tool is selected from among the tools, and as shown in FIG. 4, a mouse is operated to select a point on the design drawing by means of mouse pointer K1. Origin setting portion 51 then sets this selected point as an origin T0, and a tetragon generation menu 62, such as that shown in FIG. 5, is displayed.

Tetragon generation menu 62 is provided, in the order starting from the top, with golden sequence display columns 63 and 64, code display columns 65 and 66, and golden value display columns 67 and 68.

Golden sequence display columns 63 and 64 are made up of an X-direction golden sequence display column 63 concerning dimensions in the X-direction (up/down direction in the design drawing) from the origin and a Y-direction golden sequence display column 64 concerning dimensions in the Y-direction (left/right direction in the design drawing) from the origin.

The contents of each of the golden sequence display columns 63 and 64 are arranged from three consecutive primary golden values XGS and secondary golden values YP corresponding to these primary golden values XGS that have been read out from storage device 20, and these primary golden values XGS and secondary golden values YP are displayed as white circles. Primary golden values before or after the presently displayed primary golden values and the secondary golden values YP corresponding to these primary golden values XGS before or after the presently displayed primary golden values can be displayed by the selection "Δ" or "∇" by the operator.

Code display columns 65 and 66 are made up of an X-direction code display column 65, which displays the code of the golden value selected in X-direction golden sequence display column 63 in mutual linkage with X-direction golden sequence display column 63 and a Y-direction code display column 66, which displays the code of the golden value selected in Y-direction golden sequence display column 64 in mutual linkage with Y-direction golden sequence display column 64.

The code of a golden value is displayed in the form of XGS, YP, that is, as a combination of primary golden value XGS and secondary golden value YP.

Code display columns 65 and 66 are also arranged so that codes before and after the presently displayed codes can be displayed by the selection "Δ" or "∇" by the operator.

Golden value display columns 67 and 68 are made up of an X-direction golden value display column 67, which displays a golden value in mutual linkage with X-direction golden sequence display column 63, and a Y-direction golden value display column 68, which displays a golden value in mutual linkage with Y-direction golden sequence display column 64.

When a golden value is selected in each of golden sequence display columns 63 and 64, the selected golden values are indicated by black circles, the codes of the selected golden values are displayed in code display columns 65 and 66 and the selected golden values are displayed in golden value display columns 67 and 68.

Also, when the operator selects a golden value by means of a code in each of code display columns 65 and 66, the selected golden values are indicated by black circles in golden sequence display columns 63 and 64 and displayed in golden value display columns 67 and 68.

When "OK" is selected in a condition where the golden values have been selected, first point setting portion 52 sets a point T1, which is separated from origin T0 in the X direction by just the golden value displayed in golden value display column 67, and a point T2, which is separated from origin T0 in the Y direction by just the golden value displayed in golden value display column 68, and generates a tetragon passing through these points T0, T1, and T2, that is, a golden tetragon 70, with which the four sides are equal to golden values, as shown in FIG. 4.

As another method of inputting golden values, there is also the following method.

In tetragon generation menu 62, when arbitrary numerical values are input in golden value display columns 67 and 68, golden values that most closely approximate the input numerical values are selected from among the primary golden values and secondary golden values by second point setting portion 53, and accordingly, the numerical values in golden value display columns 67 and 68 are changed and points T1 and T2 separated from origin T0 by just the selected golden values are displayed. When "OK" is selected in this condition, a tetragon that passes through these points T0, T1, and T2, that is, a golden tetragon 70, with which the four sides are equal to golden values, is generated.

[Generation of Dimension Lines]

Figure 6:
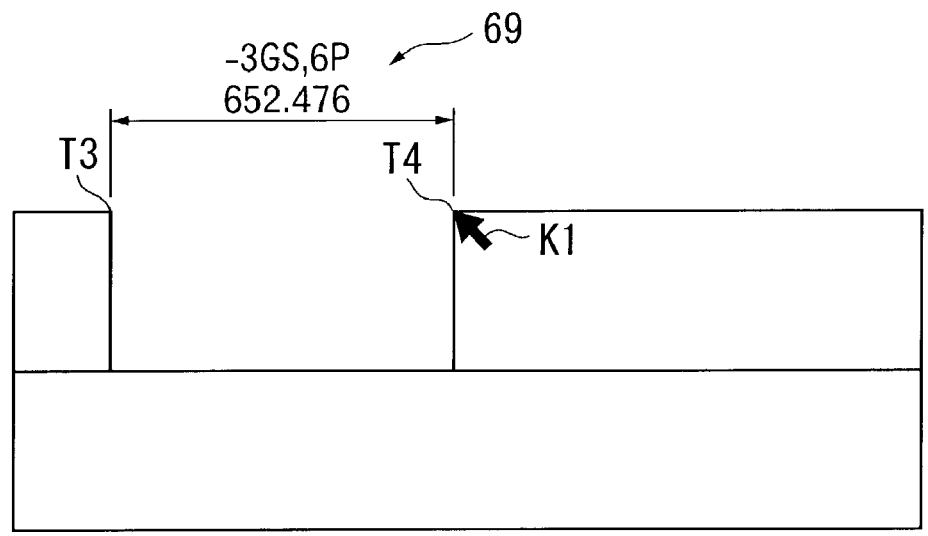
FIG. 6 is a diagram, showing a dimension line generating screen of the abovementioned embodiment.

Also, in the condition where a shape has been generated, the operator selects two points T3 and T4 on the design drawing by means of mouse pointer K1 as shown in FIG. 6, golden value display portion 55 computes the dimension between the selected two points, and if the computed dimension matches a golden value, among the golden values of the respective orders, down to the priorly input number of significant digits, the code of the golden value that expresses this dimension, is displayed as dimension line 69.

This embodiment thus provides the following effects:

(1) Since secondary golden values YP are provided as intermediate values of mutually primary golden values XGS and tertiary golden values ZP are provided as intermediate values of mutually secondary golden values YP, even when the difference between mutually primary golden values XGS is large, a suitable number of intermediate values of primary golden values XGS can be prepared and golden values that are necessary for design can be obtained readily from these prepared golden values. Design of a high degree of freedom can thus be realized using golden values.

(2) Since golden values XGS, YP, and ZP of the respective orders of primary, secondary, and tertiary are provided and, for example, a priority order in accordance with the order of the golden values can be set in regard to the golden values to be employed in the design of an object, the designing work can be carried out even more readily.

(3) Since the primary to tertiary golden values are provided with codes XGS, YP, and ZP and the golden values of the respective orders can thus be specified accurately, golden values can be expressed as combinations of different golden values, that is, compatibility can be secured mutually among golden values and objects with compatibility can be designed readily.

(4) Since the primary to tertiary golden values are provided with codes XGS, YP, and ZP and the golden values of the respective orders, which, as a rule, are expressed as irrational numbers, can thus be specified readily by the codes, accurate designing work can be carried out using the golden values themselves, not approximations of golden values.

By computing the primary to tertiary golden values in a systematic manner and providing these values with codes XGS, YP, and ZP in a systematic manner, the golden values can be specified readily from the codes to enable the designing work to be performed even more readily.

(5) Since origin setting portion 51 and first point setting portion 52 are provided to enable an operator to simply select a point and golden values to set the selected point as origin T0, to set points T1 and T2, which are separated from origin T0 in the X direction and Y direction, respectively, by just the selected golden values, in the design drawing, and to generate golden tetragon 70, which passes through these points T0, T1, and T2, designing work using golden values can be carried out readily and yet speedily.

(6) Since origin setting portion 51 and second point setting portion 53 are provided to enable an operator to simply select a point and input numerical values to set the selected point as origin T0, to select golden values approximating the input numerical values, to set points T1 and T2, which are separated from origin T0 in the X direction and Y direction, respectively, by just the selected golden values, in the design drawing, and to generate golden tetragon 70, which passes through these points T0, T1, and T2, designing work using golden values can be carried out readily and yet speedily.

(7) Since significant digit order setting portion 54 and golden value displaying portion 55 are provided to enable an operator to simply enter a numerical value and select two points T3 and T4 to set the number of significant digits of the golden values and make the dimension between two arbitrary points be displayed in golden values, designing work using golden values can be carried out readily and yet speedily.

The present invention is not limited to the above-described embodiment and modifications, improvements, etc., within a scope in which the objects of this invention can be achieved are included within this invention.

For example, though with the present embodiment, primary to tertiary numerical sequences were set, this invention is not limited thereto, and quaternary and pentanary numerical sequences may be set as well.

Also, though with the embodiment, golden tetragon 70 was generated by setting origin T0 and thereafter selecting golden values, this invention is not limited thereto, and the following procedure may be carried out instead.

Figure 7:
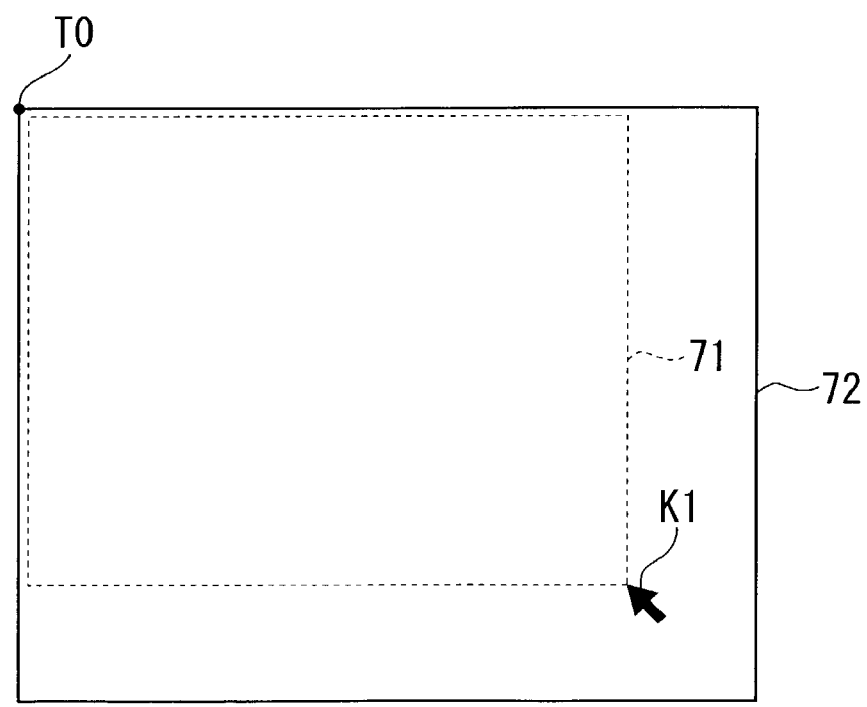
FIG. 7 is a diagram, showing a tetragon generating screen of a modification example of this invention.

As shown in FIG. 7, if after setting origin T0, mouse pointer K1 is dragged from origin T0, a tetragon 71, having origin T0 and mouse pointer K1 as two points on a diagonal line, is displayed by broken lines. At the same time, of the golden tetragons having fours sides that are equal to golden values, a golden tetragon 72, which is closest in shape to tetragon 71 that is generated by the broken lines, is displayed by solid lines. When the operator stops dragging in this condition, the displayed golden tetragon 72 is set and golden tetragon 72 is thereby generated.

Such an embodiment of FIG. 7, in addition to providing the effects of the above-described embodiment, enables an operator to simply drag mouse pointer K1 to make golden tetragons be displayed successively and thereby enables arbitrary golden tetragons to be imaged more readily and the designing work to be carried readily and speedily.

In a case where this invention is to be applied to a CAD software, etc., a simpler floating pallet, etc., may be used or other auxiliary functions may be added, etc.

Figure 8:
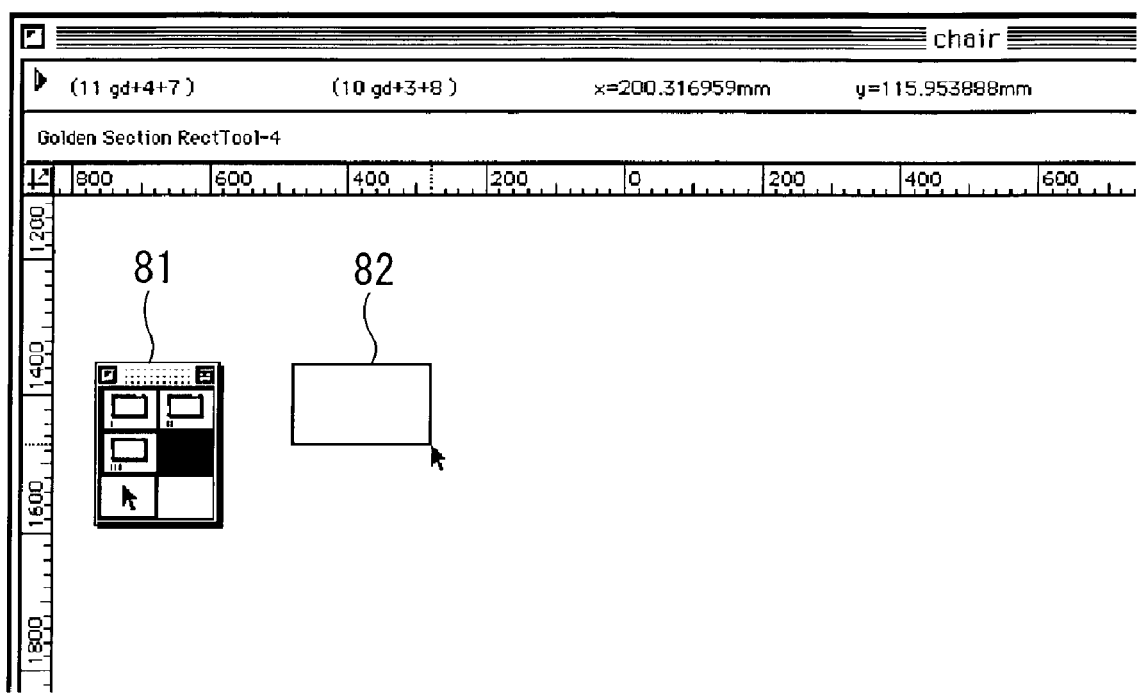
FIG. 8 is a diagram, showing a tetragon generating screen of another modification example of this invention.

As shown in FIG. 8, a pallet 81 is provided with buttons for selecting primary to tertiary golden values in the process of drawing a tetragon, and by performing a tetragon drawing operation by selecting a button, a golden division tetragon 82 is drawn. Here, a tetragon with a lateral length of "11gd+4+7" and a vertical length of "10gd+3+8" is drawn. "11gd+4+7" is a code for identifying a golden value. In regard to the example of the lateral dimension, when a code is indicated up to "11gd", the code indicates a primary golden value, when a code is indicated up to "11gd+4", the code indicates a secondary golden value, and when a code is indicated up to "11gd+4+7", the code indicates a tertiary golden value.

Figure 9:
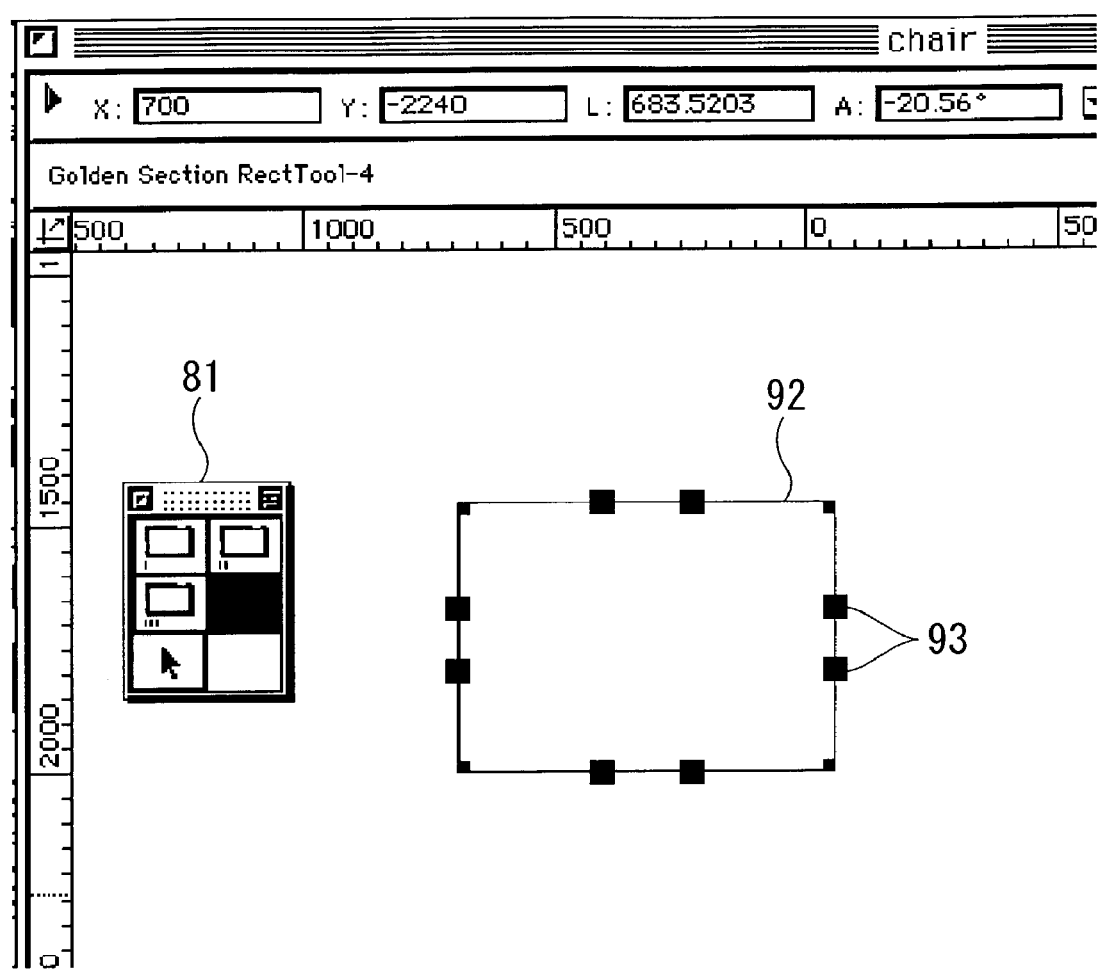
FIG. 9 is a diagram, showing a tetragon generating screen of another modification example of this invention.

As shown in FIG. 9, in drawing a tetragon 92, the golden division points 93 may be displayed on its four sides.

Figure 10:
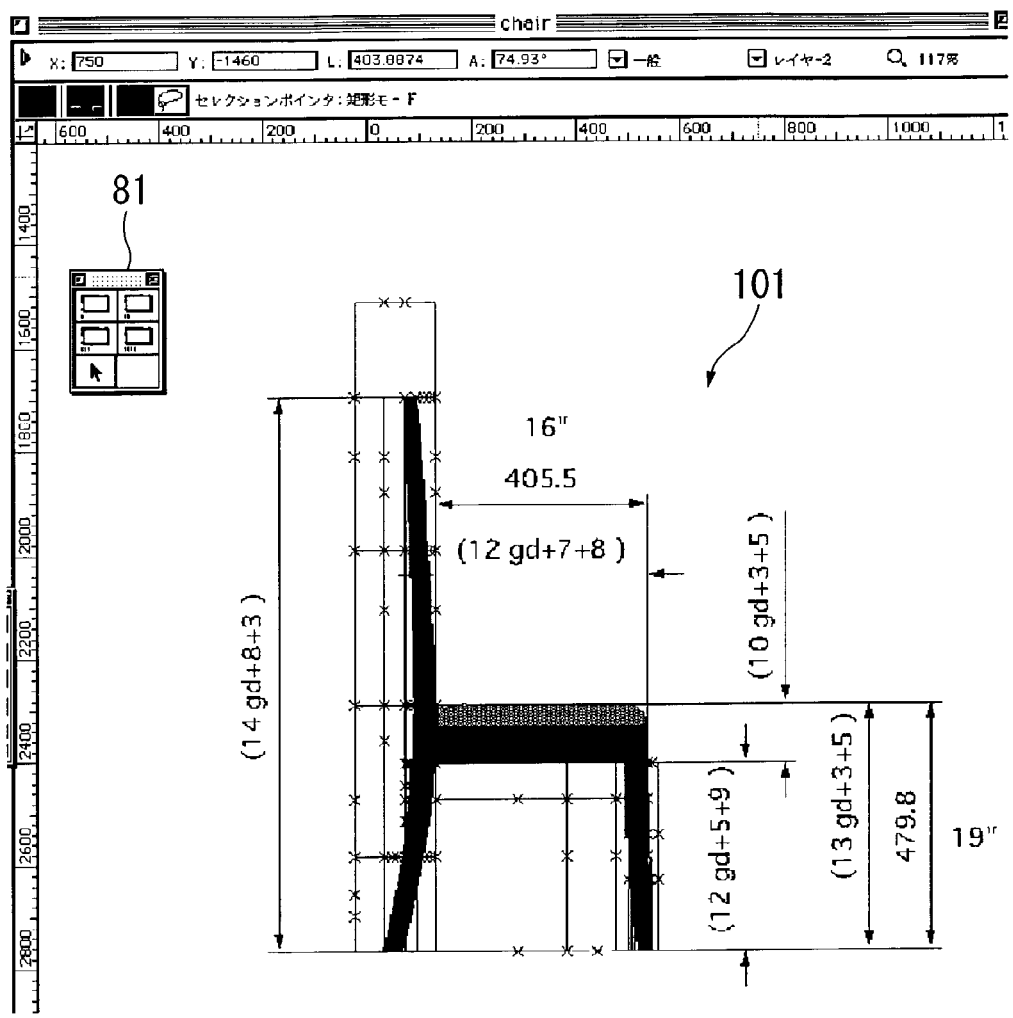
FIG. 10 is a diagram, showing a chair design screen of a modification example of this invention.

FIG. 10 illustrates the work of designing a chair using golden division. Here, a chair 101 with a seat surface of 16 inches and a seat surface height of 19 inches is designed. The height of the backrest, the length of the feet, etc., are all designed by automatic generation based on the golden division. By using tertiary golden values, designs that use the golden division are made possible with values close to the targeted dimensions.

What is claimed is:

1. A method of designing an object using the golden ratio, said method comprising:

a primary sequence setting step for calculating primary golden values each being expressed as $BL \times \phi^n$, where BL is a set reference value, $\phi$ is the golden ratio, and n is a negative or positive integer, wherein the primary golden values are sorted by magnitude to obtain a primary sequence and are assigned first codes in accordance with n;

a secondary sequence setting step for calculating secondary golden values by (i) setting one of the primary golden values as a primary reference value and (ii) adding to or subtracting from said primary reference value other primary golden values in accordance with a predetermined rule, wherein the secondary golden values are sorted by magnitude to obtain a secondary sequence and are assigned second codes associated with the primary reference value; and a designing step for designing the object based on the primary and secondary golden values;

wherein said designing step comprises displaying the designed object together with dimensions of the object, said dimensions being displayed using the first and second codes rather than the primary and secondary golden values.

2. The method of claim 1, further comprising a tertiary sequence setting step for calculating tertiary golden values by (i) setting one of the secondary golden values as a secondary reference value and (ii) adding to or subtracting from said secondary reference value primary golden values in accordance with a predetermined rule, wherein the tertiary golden values are sorted by magnitude to obtain a tertiary sequence and are assigned third codes associated with the secondary reference value;

wherein the designing step comprises designing the object based on the primary, secondary and tertiary golden values.

3. The method of claim 1, wherein all the secondary golden values in said secondary sequence are between two consecutive primary golden values in the primary sequence; and one of said two consecutive primary golden values is the primary reference value.

4. The method of claim 3, wherein the secondary sequence setting step comprises calculating multiple secondary sequences, each for one pair of consecutive primary golden values in the primary sequence by using one of said consecutive primary golden values as the primary reference value for said secondary sequence.

5. The method of claim 4, further comprising a tertiary sequence setting step for calculating tertiary golden values by (i) setting one of the secondary golden values as a secondary reference value and (ii) adding to or subtracting from said secondary reference value primary golden values in accordance with a predetermined rule, wherein the tertiary golden values are sorted by magnitude to obtain a tertiary sequence and are assigned third codes associated with the secondary reference value;

wherein the designing step comprises designing the object based on the primary, secondary and tertiary golden values.

6. The method of claim 5, wherein all the tertiary golden values in said tertiary sequence are between two consecutive secondary golden values in one of the secondary sequences; and one of said two consecutive secondary golden values is the secondary reference value.

7. The method of claim 6, wherein the tertiary sequence setting step comprises calculating multiple tertiary sequences, each for one pair of consecutive secondary golden values in each secondary sequence by using one of said consecutive secondary golden values as the secondary reference value for said tertiary sequence.

8. A computer-readable medium storing a program comprising instructions that, when executed by a computer, cause the computer to execute a method of designing an object using the golden ratio, said method comprising:

a primary sequence setting step for calculating primary golden values each being expressed as $BL \times \phi^n$, where BL is a set reference value, $\phi$ is the golden ratio, and n is a negative or positive integer, wherein the primary golden values are sorted by magnitude to obtain a primary sequence and are assigned first codes in accordance with n;

a secondary sequence setting step for calculating secondary golden values by (i) setting one of the primary golden values as a primary reference value and (ii) adding to or subtracting from said primary reference value other primary golden values in accordance with a predetermined rule, wherein the secondary golden values are sorted by magnitude to obtain a secondary sequence and are assigned second codes associated with the primary reference value; and a designing step for designing the object based on the primary and secondary golden values;

wherein said designing step comprises displaying the designed object together with dimensions of the object, said dimensions being displayed using the first and second codes rather than the primary and secondary golden values.

9. A method of designing an object using the golden ratio, said method comprising:

a primary sequence setting step for calculating primary golden values each being expressed as $BL \times \phi^n$, where BL is a set reference value, $\phi$ is the golden ratio, and n is a negative or positive integer, wherein the primary golden values are sorted by magnitude to obtain a primary sequence and are assigned first codes in accordance with n;

a secondary sequence setting step for calculating secondary golden values by (i) setting one of the primary golden values as a primary reference value and (ii) adding to or subtracting from said primary reference value other primary golden values in accordance with a predetermined rule, wherein the secondary golden values are sorted by magnitude to obtain a secondary sequence and are assigned second codes associated with the primary reference value;

a designing step for designing the object based on the primary and secondary golden values; and a tertiary sequence setting step for calculating tertiary golden values by (i) setting one of the secondary golden values as a secondary reference value and (ii) adding to or subtracting from said secondary reference value primary golden values in accordance with a predetermined rule, wherein the tertiary golden values are sorted by magnitude to obtain a tertiary sequence and are assigned third codes associated with the secondary reference value;

wherein the designing step comprises displaying the designed object together with the primary, secondary and tertiary golden values, and selecting dimensions of the object based on the displayed golden values.

* * * * *